United States Patent [19]

Eyraud et al.

[11] Patent Number: 5,683,613
[45] Date of Patent: Nov. 4, 1997

[54] FERROELECTRIC PEROVSKITES

[75] Inventors: Lucien Eyraud, Lyons; Michel M. Boisrayon, Evenos; Paul A. Eyraud, Ecully; Franck F. Eyraud, Montrouge; David D. Audigier, Rilleux la Pape, all of France

[73] Assignee: Etat Francais as represented by the Delegue General pour l 'Armement, Paris, France

[21] Appl. No.: 611,409

[22] Filed: Mar. 6, 1996

[30] Foreign Application Priority Data

Mar. 9, 1995 [FR] France .................... 95 02744

[51] Int. Cl.⁶ .................. C04B 35/49; C04B 35/491; C04B 35/493
[52] U.S. Cl. .................. 252/62.9 R; 252/62.9 PE; 501/151; 501/134
[58] Field of Search .............. 252/62.9 R, 62.9 PE; 501/151, 134; 310/357, 358

[56] References Cited

U.S. PATENT DOCUMENTS

| | | | |
|---|---|---|---|
| 3,021,441 | 2/1962 | Howatt | 310/8 |
| 3,248,328 | 4/1966 | Tien et al. | 252/62.9 R |
| 3,753,911 | 8/1973 | Walker | 501/137 |

FOREIGN PATENT DOCUMENTS

| | | |
|---|---|---|
| 0 061 389 | 9/1982 | European Pat. Off. . |
| 2 248 587 | 5/1975 | France . |
| 2248587 | 5/1975 | France . |
| 52-27599 | 8/1975 | Japan . |
| 53-3698 | 6/1976 | Japan . |
| 52-27599 | 3/1977 | Japan . |
| 53-3698 | 1/1978 | Japan . |
| 55-55589 | 4/1980 | Japan ................. 252/62.9 R |

OTHER PUBLICATIONS

Sych et al, "Preparation of Fluorine-containing Barium Titanate", Inorg. Mater., vol. 8(7), Jul. 1972, pp. 1130–1133.

*Primary Examiner*—Melissa Bonner
*Attorney, Agent, or Firm*—Oliff & Berridge

[57] ABSTRACT

The invention relates to pulverulent ferroelectric perovskites having piezoelectric properties up to a temperature of approximately 300° C. as well as their manufacturing processes. The processes include a step wherein fluorine ions are inserted into the perovskites at anionic sites and/or oxygen vacancies. The perovskites are used as raw materials for the production of piezoelectric ceramics which find application in a variety of fields, such as electroacoustic transducers, piezoelectric motors, welding and industrial cleaning.

5 Claims, 1 Drawing Sheet

FERROELECTRIC PEROVSKITES

BACKGROUND OF THE INVENTION

The present invention relates to ferroelectric perovskites having piezoelectric properties up to a temperature of approximately 300° C., preferably of the lead titanate or barium titanate type, and in particular, lead titanozirconate (herein referred to as PZT) and their manufacturing processes.

The perovskites of the lead titanate, lead zirconate, barium titanate and PZT type are used as a raw material for piezoelectric ceramics of electro-acoustic transducers. The perovskites of the barium titanate type are also used in condensers.

Patent FR 2,248,587 describes dielectric materials of the fluoridated type, notably perovskites, used for the production of condensers. These materials are not ferroelectric at ambient temperature and the previously mentioned patent states that their dielectric properties are improved and stabilized depending on the temperature.

Without limiting the scope of the invention, the present invention relates to "power ceramics", that is to say, ceramics used in transducers emitting acoustic waves. Moreover, the invention also encompasses ceramics present in transducers used in reception.

The ceramics of the PZT type correspond to the following formula of the $ABO_3$ type:

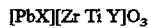

where X is an ion of substitution of site A (i.e., PbX) and Y an ion of substitution of site B (i.e., ZrTiY), the size and valence of these ions of substitution being consistent with the balance of the perovskite lattice. The heterovalent cationic substitutions most often used to obtain a lattice with a lack of oxygen are substitutions by sodium or potassium in site A and by iron, manganese or nickel in site B.

The presence of these oxygen vacancies results in a reduction of the dielectric losses in high levels of electric fields.

The powders of these products, preferably obtained either by reaction in solid phase or by coprecipitation, are usually agglomerated with a suitable bonding material, dried, molded under pressure and sintered at high temperature (between 1,000° and 1,300° C.). Compact ceramics are thus obtained which can be machined, fitted with electrodes, then polarized under continuous voltage in an insulating bath.

The ceramics obtained, when used in emission, have a good ratio of energy dissipated under the calorific form to the average energy supplied. Indeed, the tangent of the loss angle, at 1 kHz is in a low electric field (5 V/mm) of approximately 0.3 to 0.5%. The value of this tangent is between 0.8 and 1.5% in fields of approximately 400 V/mm, this electric field value being usual for supplying the transducers of emission which equip sonar antennas. These losses result in heating which can limit the utilization field of the powder transducers. In other fields, such as machining, welding, piezo-electric motors and industrial cleaning, where the ceramics are used at the extreme limit of their possibilities, mechanical failures often appear.

Conventional ceramics, used in reception, have an undesirable signal/noise ratio, which lowers the sharpness of the emitted signal.

Moreover, the rate of waste of the ceramics (i.e., the rate of ceramics having no predetermined piezoelectric characteristics) manufactured by standard industrial processes is significant, these products being very sensitive to manufacturing conditions.

These ceramics with oxygen vacancies have the following defects. The non-negligible electric conductivity in relation to the non-lacking material can result in electric breakdowns during the polarization. A non-negligible hysteresis of the electro-mechanical characteristics of the ceramics subjected to high levels of stresses is noted as well as the aging of these characteristics. Finally, the stability of the remanent polarization under a high mechanical and electrical stress level is insufficient.

Therefore, the present invention aims at remedying the above mentioned disadvantages and particularly, reducing the global losses (dielectric, electric and mechanical losses) appearing in ferroelectric perovskite-based ceramics used in emission. The present invention also seeks increased stability in ferroelectric perovskite-based ceramics used in emission.

The present invention also aims at increasing the signal/noise ratio of ceramics used in reception, and in all cases, reducing the rate of waste during their manufacture.

SUMMARY OF THE INVENTION

Thus, an object of the present invention is a manufacturing process of producing pulverulent ferroelectric perovskites, having piezoelectric properties up to a temperature of approximately 300° C., the method comprising insertion of fluoride ions in oxygen vacancies and/or anionic sites of the perovskite lattice.

In one preferred embodiment the ferroelectric perovskites are formed by means of a liquid wet process according to the present invention, the process preferably comprising the following successive steps:

coprecipitating the main cations forming the perovskite, mixing the deposit formed with a metallic or non-metallic fluoride, and thermally treating the mixture at approximately 600° C., allowing the insertion of fluoride ions in oxygen vacancies and/or anionic sites of the perovskite lattice.

The coprecipitating step can involve adding a lead salt and a barium salt to an aqueous solution and adjusting the solution pH to about 9 by adding a material to the solution.

As an alternative to the wet process, the ferroelectric perovskites are formed by means of a solid process, this process preferably comprising the following successive steps:

mixing a fluoridated compound with various compounds, preferably oxides, hydroxides and oxalates of the metals and/or metalloids forming the perovskite, and thermally treating the mixture at a temperature of approximately 600° C., allowing the perovskite formation and fluoridation.

The mechanism of fluoridation comprises introducing the fluoride ions in oxygen vacancies and/or anionic sites of the perovskite lattice. One of ordinary skill in the art knows that oxygen vacancies are created either by the introduction into the lattice of a cation with a valence lower than that of the cation for which it is substituted (e.g., the introduction of a $Fe^{3+}$ cation for a $Ti^{4+}$ cation in $PbZrTiO3$ perovskite), or by the presence of a cation with a valence lower than its normal valence (e.g., the presence of the $Ti^{3+}$ cation instead of a $Ti^{4+}$ cation in the same perovskite). Then, during the coprecipitation, a nonstoichiometric compound is formed which is deficient in oxygen and cationic charges.

Moreover, the process according to the invention makes it possible to obtain a compound by double substitution wherein a cation substitution and an anion substitution takes place.

To make it possible to obtain a ferroelectric fluoridated perovskite having the properties as required above, it is necessary for the lattice to have oxygen vacancies or deficits, and for that, one of ordinary skill in the art knows that a cation must be replaced by a cation having a lower valence. Therefore, a double substitution is required: a cationic and an anionic substitution (this substitution being the substitution of oxygen by fluorine).

It is possible to produce power piezoelectric ceramics, starting from the fluoridated perovskites, preferably of the fluorinated PZT type.

Thus, the ceramics of the fluoridated PZT type, prepared by the processes according to the invention, preferably have a molar fraction of fluorine at least equal to 0.5%. The fluoridated ceramics unexpectedly possess a tangent of the loss angle lower than about 0.6% below 400 V/mm. This makes it possible to significantly increase the volumic acoustic power of the power ceramics and therefore to build various device as using these ceramics, which are more compact and less expensive. It is also possible to significantly increase the signal/noise ratio of the hydrophones by using ceramics of the present invention in reception.

Moreover, the rate of waste of ceramics is reduced when the processes according to the invention are used.

DESCRIPTION OF A PREFERRED EMBODIMENT

Figure 1:
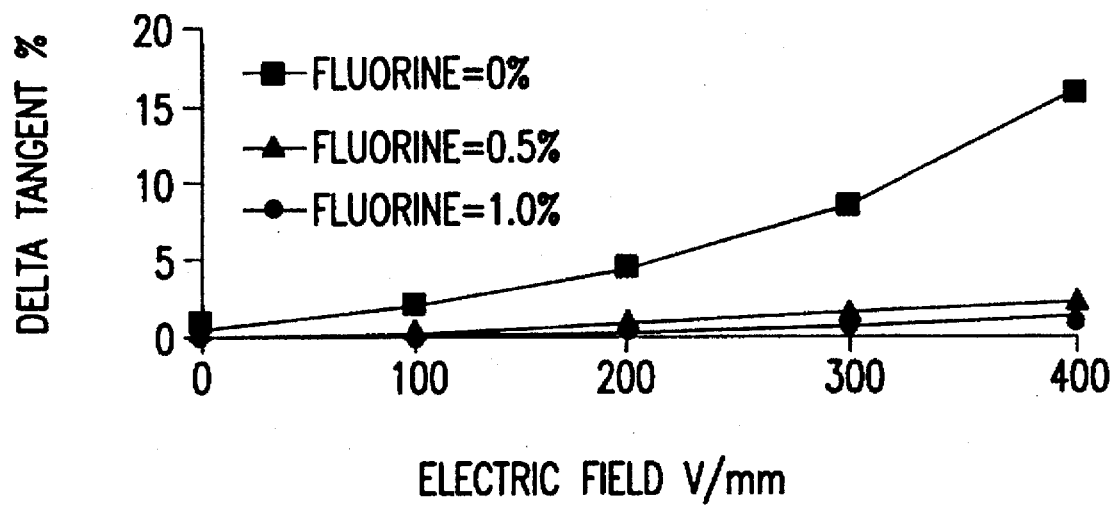
FIG. 1 graphically shows the influence of fluoridation on perovskite lattice properties without cationic substitution.
Figure 2:
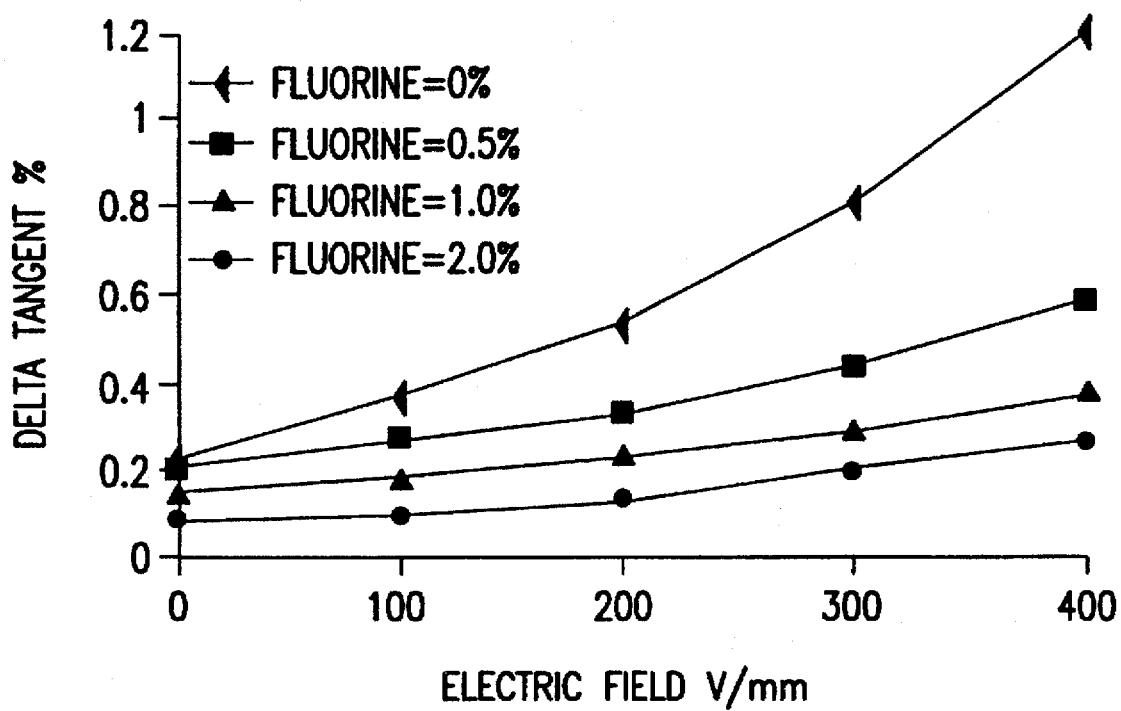
FIG. 2 graphically shows the influence of fluoridation on perovskite lattice properties with cationic substitution.

In FIGS. 1 and 2, the variation of the tangent of the loss angle of a ceramic versus the electric field to which it is subjected is graphically displayed. FIG. 1 shows the influence of fluoridation of a perovskite lattice, without cationic substitution (transformation of $Ti^{4+}$ to $Ti^{3+}$), on the dielectric losses of the ceramics. FIG. 2 shows the influence of fluoridation of a perovskite lattice by substitution of $Fe^{3+}$ ions for $Ti^{4+}$ ions.

These two figures show that the dielectric losses of the ceramics of the fluoridated PZT type are clearly lower than that of the non-fluoridated ceramics, especially with strong electric fields. The percentages indicated in these figures are molar percentages.

In the case where cationic transformation is induced (FIG. 1), the dielectric losses of the fluoridated PZT type are significantly reduced.

These ceramics are not optimized for power ceramics. Moreover, the fluoridation increases the signal/noise ratio, which is an advantage in reception.

The fluoridation of a perovskite lattice having a cationic substitution (FIG. 2; $Fe^{3+}$ is substituted for $Ti^{4+}$) allows the use of the ceramics in emission, even with strong electric fields.

In addition, the rate of waste of manufactured ceramics is reduced when using these new processes.

Two preferred examples of fabrication of fluorinated PZT perovskites are given below. These examples are for illustrative purposes only and should not be interpreted to limit the present invention in any way.

EXAMPLE 1

320 g of oxalic acid, 223.02 g of zirconium butylate, 163.52 g of titanium butylate and 2.43 g of iron chloride are added to 4,000 $cm^3$ of a distilled water solution. This mixture is shaken until complete dissolution of the compounds occurs. 335.90 g of lead acetate and 30.65 g of barium acetate dissolved in 1,500 $cm^3$ of water are then added.

This solution is shaken for four hours, then its pH is adjusted to about 9 by adding ammonium hydroxide. The deposit formed is collected by decanting and filtering the solution and then dried. The deposit contains oxalates and hydroxides of the various metals mentioned.

The deposit and 1.225 g of lead fluoride are then mixed while grinding for one hour. Once it is dry, this mixture is subjected to a thermal treatment for ten hours at about 600° C., then for four hours at 800° C. 319.57 g of fluoridated PZT powder are obtained. The efficiency is 99.3%.

EXAMPLE 2:

320 g of oxalic acid, 223.01 g of zirconium butylate, 163.52 g of titanium butylate, 1.62 g of iron chloride and 0.73 g of manganese acetate are added to 4,000 $cm^3$ of a distilled water solution. This mixture is shaken until complete dissolution of the compounds. 335.90 g of lead acetate and 30.65 g of barium acetate dissolved in 1,500 $cm^3$ of water are then added.

This solution is shaken for four hours, then its pH is adjusted to about 9 by adding ammonium hydroxide.

The deposit formed is collected by decanting and filtering the solution and then dried. The deposit and 1,838 g of lead fluoride are mixed while grinding for one hour.

Once it is dry, the mixture is subjected to a thermal treatment for ten hours at about 600° C. then for four hours at 800° C. 318 g of fluoridated PZT powder are obtained. The efficiency is 99%.

10% by weight of polyvinyl alcohol are added to these powders. The mixture is dried then broken up. The product obtained is molded under a pressure of 1,000 bars, then thermally treated for four hours at 450° C. to remove the bonded material and then sintered. After machining, discs with either a 20 mm diameter and 10 mm thickness, or a 6.35 mm diameter and 15 mm thickness are obtained. The ceramics obtained are fitted with electrodes, and thus metallized and polarized in an insulating bath at 150° C. by means of an electric field of approximately 3 to 5 kV/mm.

The fluorinated ceramics produced by the disclosed method of manufacture show improved properties compared with non-fluorinated ceramics and conventional fluorinated ceramics. In addition to the applications disclosed herein, other suitable applications will be apparent from the above disclosure.

What is claimed is:

1. A process of making pulverulent ferroelectric perovskites having piezoelectric properties up to a temperature of approximately 300° C., said process comprising substituting fluorine for oxygen in a perovskite lattice at locations including at least one of anionic sites and oxygen vacancies, wherein said process comprises the following steps:

coprecipitating main cations which form the perovskite to form a deposit comprising the main cations, wherein the coprecipitating comprises:

forming an aqueous solution comprising oxalic acid, titanium butylate, zirconium butylate, iron chloride and manganese acetate;

adding at least one lead salt and at least one barium salt to the aqueous solution;

adjusting a solution pH to about 9 by adding a material to the aqueous solution to form the deposit comprising the main cations; and separating the deposit comprising the main cations from the aqueous solution and drying the deposit comprising the main cations;

mixing the deposit comprising the main cations with a lead fluoride to form a mixture; and thermally treating the mixture at approximately 600° C.

2. Pulverulent ferroelectric perovskite comprising at least one of the elements Pb, Ba, Ti and Zr, and having piezoelectric properties up to a temperature of approximately 300° C. and comprising fluorine ions within the perovskite lattice, wherein the perovskite has the following formula:

$$[PbX][Zr\ Ti\ Y]O_3$$

wherein X is a cation substituted for Pb, and Y is a cation substituted for Zr or Ti, and wherein X is selected from the group consisting of sodium and potassium, and Y is selected from the group consisting of iron, manganese and nickel.

3. The perovskite of claim 2, wherein the mole fraction of fluorine is at least equal to 0.5%.

4. A fluoridated ferroelectric perovskite ceramic having piezoelectric properties up to a temperature of approximately 300° C., said ceramic comprising a sintered mass of the fluorinated perovskite powder of claim 2.

5. The ceramic of claim 4, wherein the ceramic possesses a tangent of loss angle lower than about 0.6% below 400 V/mm.

* * * * *